(12) United States Patent
Joharapurkar et al.

(10) Patent No.: US 8,830,207 B1
(45) Date of Patent: *Sep. 9, 2014

(54) METHOD AND APPARATUS FOR IMPROVING DYNAMIC RANGE OF A TOUCHSCREEN CONTROLLER

(71) Applicant: Maxim Integrated Products, Inc., San Jose, CA (US)

(72) Inventors: Ashutosh R. Joharapurkar, Bangalore (IN); Patrick Chan, Cupertino, CA (US); David L. Allen, San Jose, CA (US); Natarajan Viswanathan, Saratoga, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/070,955

(22) Filed: Nov. 4, 2013

Related U.S. Application Data

(63) Continuation of application No. 12/986,776, filed on Jan. 7, 2011, now Pat. No. 8,559,167.

(60) Provisional application No. 61/326,830, filed on Apr. 22, 2010.

(51) Int. Cl.
G06F 3/045 (2006.01)
G06F 3/044 (2006.01)

(52) U.S. Cl.
CPC .................. *G06F 3/044* (2013.01)
USPC ...... 345/174; 345/173; 178/18.01; 178/18.06

(58) Field of Classification Search
USPC .................. 345/173, 174; 178/18.01–18.11
See application file for complete search history.

(56) References Cited

U.S. PATENT DOCUMENTS

| 4,527,096 A | 7/1985 | Kindlmann |
| 5,168,153 A * | 12/1992 | Ikeda ..................... 250/214 A |
| 5,313,141 A | 5/1994 | Kimball |

(Continued)

FOREIGN PATENT DOCUMENTS

| WO | 9743825 | 11/1997 |
| WO | 2004040240 | 5/2004 |

OTHER PUBLICATIONS

International Search Report and Written Opinion dated Dec. 3, 2009; PCT Application No. PCT/US2009-61359 filed Oct. 20, 2009.

(Continued)

*Primary Examiner* — Koosha Sharifi-Tafreshi
(74) *Attorney, Agent, or Firm* — Advent, LLP

(57) ABSTRACT

A touchscreen system for increasing the dynamic range of the system comprising a touchscreen coupled to an offset cancellation element and a capacitance measuring element. The offset cancellation element is configured to be dynamically changed in capacitance such that it offsets parasitic and sensor capacitances of the touchscreen sensors thereby leaving only touch event capacitance to be measured by the measuring element. The offset cancellation element is able to adjust to the initial unwanted capacitances of each sensor as well as dynamically adjust to changes in the unwanted capacitance due to the environment. In some embodiments, the offset cancellation element is a capacitance digital-to-analog converter that is controlled by a controller for offsetting the unwanted capacitance. As a result, the touchscreen system is able to utilize a small integrating capacitor thereby lowering cost and improving the dynamic range of the system.

10 Claims, 8 Drawing Sheets

(56) References Cited

U.S. PATENT DOCUMENTS

| | | | |
|---|---|---|---|
| 5,463,283 | A | 10/1995 | Sanderson |
| 5,463,388 | A | 10/1995 | Boie et al. |
| 5,789,870 | A | 8/1998 | Remson |
| 6,466,036 | B1 | 10/2002 | Philipp |
| 6,937,124 | B1 | 8/2005 | Nakamura et al. |
| 7,061,327 | B2 | 6/2006 | Doy |
| 7,176,753 | B2 | 2/2007 | Noda et al. |
| 7,283,120 | B2 | 10/2007 | Grant |
| 2002/0011991 | A1* | 1/2002 | Iwasaki et al. ............ 345/173 |
| 2003/0067449 | A1 | 4/2003 | Yoshikawa et al. |
| 2003/0174121 | A1 | 9/2003 | Poupyrev et al. |
| 2006/0119586 | A1 | 6/2006 | Grant et al. |
| 2007/0074913 | A1 | 4/2007 | Geaghan et al. |
| 2007/0268272 | A1* | 11/2007 | Perski et al. ............ 345/173 |
| 2008/0055277 | A1 | 3/2008 | Takenaka et al. |
| 2008/0062145 | A1 | 3/2008 | Shahoian et al. |
| 2008/0158176 | A1 | 7/2008 | Land et al. |
| 2008/0158182 | A1* | 7/2008 | Westerman ............ 345/173 |
| 2009/0153152 | A1 | 6/2009 | Maharyta et al. |
| 2010/0156823 | A1 | 6/2010 | Paleczny et al. |
| 2011/0260990 | A1 | 10/2011 | Ali et al. |
| 2011/0261005 | A1 | 10/2011 | Joharapurkar |
| 2011/0261006 | A1 | 10/2011 | Joharapurkar |
| 2011/0261007 | A1 | 10/2011 | Joharapurkar |
| 2011/0261008 | A1 | 10/2011 | Joharapurkar |
| 2012/0043976 | A1* | 2/2012 | Bokma et al. ............ 324/679 |

OTHER PUBLICATIONS

Daniel Carrica, Mario Benedetti and Roberto Petrocelli; Random Sampling Applied to the Measurement of a DC Signal Immersed in Noise; Oct. 2011; pp. 1319-1323; IEEE Transactions on Instrumentation and Measurement; vol. 50, No. 5.

* cited by examiner

METHOD AND APPARATUS FOR IMPROVING DYNAMIC RANGE OF A TOUCHSCREEN CONTROLLER

RELATED APPLICATIONS

The present application is a continuation under 35 U.S.C. §120 of U.S. patent application Ser. No. 12/986,776, filed Jan. 7, 2011, entitled "METHOD AND APPARATUS FOR IMPROVING DYNAMIC RANGE OF A TOUCHSCREEN CONTROLLER", which claims priority under 35 U.S.C. §119(e) of U.S. Provisional Patent Application Ser. No. 61/326,830, filed Apr. 22, 2010, entitled "USE OF RANDOM SAMPLING TECHNIQUE TO REDUCE FINGER-COUPLED NOISE". U.S. patent application Ser. No. 12/986,776 and U.S. Provisional Patent Application Ser. No. 61/326,830 are hereby incorporated by reference in their entirety.

The following co-owned, co-filed, and co-pending applications, U.S. patent application Ser. No. 12/986,841, titled "System for and Method of Transferring Charge to Convert Capacitance to Voltage for Touchscreen Controllers,"; U.S. patent application Ser. No. 12/986,881, titled "Noise Cancellation Technique for Capacitive Touchscreen Controller Using Differential Sensing,"; U.S. patent application Ser. No. 12/986,991, titled "System Integration of Tactile Feedback and Touchscreen Controller for Near-Zero Latency Haptics Playout,"; U.S. patent application Ser. No. 12/987,008, titled "Use of Random Sampling Technique to Reduce Finger-Coupled Noise,"; and U.S. patent application Ser. No. 12/986,905, titled "Method and Apparatus for Generating Piezoelectric Transducer Excitation Waveforms Using a Boost Converter,", are all also incorporated by reference in their entireties.

BACKGROUND

Touchscreen systems are interface systems that allow a user to control one or more devices by touching a touch pad or display screen. These systems sense when a user touches the screen such as with single touches, multiple touches, pinches, swipes and other types of touches. The positions and types of these various touches is determined and interpreted by the touchscreen systems so that they can accurately respond to the user commands and input that the touches represent. There are many different methods of sensing these various touches including capacitive sensing (self and mutual), resistance sensing, sound/light wave sensing and vibration sensing. Both types of capacitive sensing systems essentially work by using one or more sensors coupled to a layer of capacitive material adapted to hold an electrical charge. When a user touches the screen it changes the amount of charge stored on the capacitive material at the point or points of contact. This change in the charge will correspond to a change in the capacitance which is measured by the sensors in the system. When there are multiple sensors, they can be used to determine the location of the touch.

One disadvantage of capacitance systems is that capacitance measured by the sensors will include not only the capacitance caused by a user touching the screen, but also the sensor capacitance of each sensor as well as other parasitic capacitances. Furthermore, this sensor and parasitic capacitances can change from sensor to sensor and from touchscreen panel to touchscreen panel. As a result, although exemplary touch events only add 1 pico-Farad of capacitance to the sensors, the charge transfer schemes/integrators used to measure the capacitance must be able to handle the much greater amount of capacitance that represents the touch capacitance added to the sensor and parasitic capacitances. Previously, the problem has been solved by choosing an integrating capacitor that is large enough to not be saturated by the total capacitance/charge received from the sensors. However, using large integrating capacitors undesirably increases cost and size of components, as well as reducing the gain and the resolution of the measurement system.

Another disadvantage of prior capacitance systems is that even if a large enough integration capacitor is chosen to compensate for the initial capacitance added by the sensor capacitance and the parasitic capacitances, these capacitances can change with environmental changes. For example, with increased humidity the added moisture in the air typically increases these unwanted capacitances which can cause an integration cap that was previously large enough to no longer be able to handle the increased measured capacitance due to the environmental changes. In such a case, the measurement system will no longer be able to tell when a sensor is being touched and the touchscreen system will become inoperable until the environment becomes less humid.

SUMMARY

Embodiments of a method and apparatus for increasing the dynamic range of a touchscreen system comprise a touchscreen coupled to an offset cancellation element and a measurement element. The offset cancellation element is configured to dynamically change in capacitance such that it offsets parasitic and sensor capacitances of the sensors of the touchscreen thereby leaving only touch event capacitance to be measured by the measuring element. The offset cancellation element is able to adjust to the initial unwanted capacitances of each sensor as well as to dynamically adjust to changes in the unwanted capacitance due to the environment. In some embodiments, the offset cancellation element is a capacitance digital-to-analog converter that is controlled by a controller for offsetting the unwanted capacitance. As a result, the touchscreen system is able to utilize a small integrating capacitor thereby lowering cost, system size and improving the dynamic range of the system.

A first aspect of the present invention is directed to a capacitance-to-voltage converter for use with a capacitive touchscreen having one or more capacitance sensors. The converter comprises a capacitance offset cancellation element for alleviating effects of parasitic capacitance on signals produced by one or more of the capacitance sensors and an analog-to-digital converter coupled to the offset cancellation element for converting the signals to digital signals. The converter further comprises a controller coupled to the offset cancellation element for dynamically adjusting the extent to which the offset cancellation element alleviates the effects of the parasitic capacitance based on the digital signals. In some embodiments, the capacitance offset cancellation element is a capacitive digital-to-analog converter. The converter further comprises a measuring element coupled between the offset cancellation element and the analog-to-digital converter. In some embodiments, the measuring element comprises a integrating capacitor with a capacitance of less than 20 picoFarads. In some embodiments, an offset value of the offset cancellation element is initially set to zero such that none of the effects of the parasitic capacitance are alleviated. In some embodiments, the controller incrementally increases the offset value from the initial zero value until the digital signals reach a predetermined value.

In some embodiments, an offset value of the offset cancellation element is initially set to a maximum value such that substantially all of the effects of the parasitic capacitance are alleviated. In some embodiments, the controller incrementally decreases the offset value from the initial maximum value until the digital signals reach a predetermined value. In some embodiments, the controller averages the value of the digital signals to determine a baseline value. In some embodiments, if the baseline reaches a threshold value, the controller adjusts an offset value of the offset cancellation element by a delta value such that the baseline is moved away from the threshold value. In some embodiments, the threshold value is an upper threshold and the offset value is increased by the delta value such that the baseline drops below the upper threshold. In some embodiments, the threshold value is a lower threshold and the offset value is decreased by the delta value such that the baseline climbs above the lower threshold. In some embodiments, when calculating the baseline value, the controller disregards the values of the digital signals when a touch event causes the values to suddenly increase and/or drop for a duration that is less than a predetermined touch period. In some embodiments, the controller adjusts the value of the digital signals by the delta value.

Another aspect of the present invention is directed to a touchscreen system. The touchscreen system comprises a capacitive touch screen having one or more capacitance sensors and a capacitance-to-voltage converter comprising a capacitance offset cancellation element for alleviating effects of parasitic capacitance on signals produced by one or more of the capacitance sensors and a analog-to-digital converter coupled to the offset cancellation element for converting the signals to digital signals. The system further comprises a controller coupled to the offset cancellation element for dynamically adjusting the extent to which the offset cancellation element alleviates the effects of the parasitic capacitance based on the digital signals. In some embodiments, the capacitance offset cancellation element is a capacitive digital-to-analog converter. The system further comprises a measuring element coupled between the offset cancellation element and the analog-to-digital converter, wherein the measuring element comprises a integrating capacitor with a capacitance of less than 20 pico-Farads. In some embodiments, an offset value of the offset cancellation element is initially set to zero such that none of the effects of the parasitic capacitance are alleviated. In some embodiments, the controller incrementally increases the offset value from the initial zero value until the digital signals reach a predetermined value. In some embodiments, an offset value of the offset cancellation element is initially set to a maximum value such that all of the effects of the parasitic capacitance are alleviated. In some embodiments, the controller incrementally decreases the offset value from the initial maximum value until the digital signals reach a predetermined value. In some embodiments, the controller averages the value of the digital signals to determine a baseline value. In some embodiments, if the baseline reaches a threshold value, the controller adjusts an offset value of the offset cancellation element by a delta value such that the baseline is moved away from the threshold value. In some embodiments, the threshold value is an upper threshold and the offset value is increased by the delta value such that the baseline drops below the upper threshold. In some embodiments, the threshold value is a lower threshold and the offset value is decreased by the delta value such that the baseline climbs above the lower threshold. In some embodiments, when calculating the baseline value, the controller disregards the values of the digital signals when a touch event causes the values to suddenly increase and/or drop for a duration that is less than a predetermined touch period. In some embodiments, the controller adjusts the value of the digital signals by the delta value.

Another aspect of the present invention is directed to a method of improving dynamic range of a capacitance-to-voltage converter for use with a touchscreen having one or more capacitance sensors. The method comprises determining an average digital output over a period with a controller, wherein the average digital output is associated with a sensor of the converter and adjusting an offset value produced by an offset cancellation element of the converter until the digital output of the converter is equal to a predetermined baseline value. In some embodiments, the capacitance offset cancellation element is a capacitive digital-to-analog converter. In some embodiments, the method further comprises initially setting the offset value to zero. In some embodiments, the method further comprises incrementally increasing the offset value from the initial zero value until the digital output equals the predetermined baseline value. Alternatively, the method further comprises initially setting the offset value to a maximum value.

Alternatively, the method further comprises incrementally decreasing the offset value from the initial maximum value until the digital output equals the predetermined baseline value. In some embodiments, the adjusting is performed periodically, in response to a user command and/or upon the startup of the touchscreen. The method further comprises determining a second average digital output over a period with a second measurement element, wherein the second average digital output is associated with a second sensor of the converter, adjusting a second offset value produced by a second offset cancellation element of the converter until the second digital output of the converter is equal to a second predetermined baseline value and obtaining a differential measurement between the first digital output as adjusted by the first offset value and the second digital output as adjusted by the second offset value. In some embodiments, the offset cancellation element is sufficiently accurate such that the adjustment is transparent to a user.

Another aspect of the present invention is directed to a method of improving dynamic range in a capacitance-to-voltage converter for use with a touchscreen having one or more capacitance sensors. The method comprises averaging a digital output associated with a sensor of the converter in order to determine a baseline value, determining a baseline threshold value and dynamically adjusting an offset value of an offset cancellation element of the converter by a delta value if the baseline value reaches the baseline threshold value such that the baseline value is distanced from the threshold value. In some embodiments, the capacitance offset cancellation element is a capacitive digital-to-analog converter. In some embodiments, adjusting the offset value causes the capacitance of the capacitive digital-to-analog converter to increase or decrease. In some embodiments, the baseline threshold value is an upper threshold of the converter and dynamic adjusting increases the offset value by the delta value such that the baseline value drops below the upper threshold. In some embodiments, the baseline threshold value is a lower threshold and the dynamic adjusting decreases the offset value by the delta value such that the baseline value climbs above the lower threshold. In some embodiments, the averaging of the digital output comprises disregarding the values of the digital output when a touch event causes the values of the digital output to increase and drop in a time period that is less than a predetermined touch period. In some embodiments, the baseline threshold value is determined based on an upper or lower limit of a measuring element of the converter. The method further comprises averaging a second digital output associated with a second sensor of the converter in order to determine a second baseline value, determining a second baseline threshold value and dynamically adjusting a second offset value of a second offset cancellation element of the converter by a second delta value if the second baseline value reaches the second baseline threshold value such that the second baseline value is set at a value distinct from the second threshold value and obtaining a differential measurement between the first digital output as adjusted by the first offset value and the second digital output as adjusted by the second offset value. In some embodiments, the offset cancellation element is sufficiently accurate such that the dynamic adjustment is transparent to a user.

DETAILED DESCRIPTION

Embodiments of the present application are directed to a touchscreen capacitance-to-voltage converter circuit. Those of ordinary skill in the art will realize that the following detailed description of the touchscreen circuit is illustrative only and is not intended to be in any way limiting. Other embodiments of the touchscreen circuit will readily suggest themselves to such skilled persons having the benefit of this disclosure.

Reference will now be made in detail to implementations of the touchscreen circuit as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions be made to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In some embodiments, the method and apparatus for improving dynamic range in a touchscreen system comprises a touchscreen coupled to an offset cancellation element and a measurement element. The offset cancellation element is configured to dynamically change in capacitance such that it offsets parasitic and sensor capacitances of the sensors of the touchscreen thereby leaving only touch event capacitance to be measured by the measuring element. The offset cancellation element is able to adjust to the initial unwanted capacitances of each sensor as well as to dynamically adjust to changes in the unwanted capacitance due to the environment. In some embodiments, the offset cancellation element is a capacitance digital-to-analog converter that is controlled by a controller for offsetting the unwanted capacitance. As a result, the touchscreen system is able to utilize a small integrating capacitor thereby lowering cost, system size and improving the dynamic range of the system. It is understood that although the system, method and apparatus described herein is in reference to a touchscreen system, it is equally able to operate as a capacitance-to-voltage converter in other capacitance responsive and capacitive measuring systems as are well known in the art.

Figure 1A:
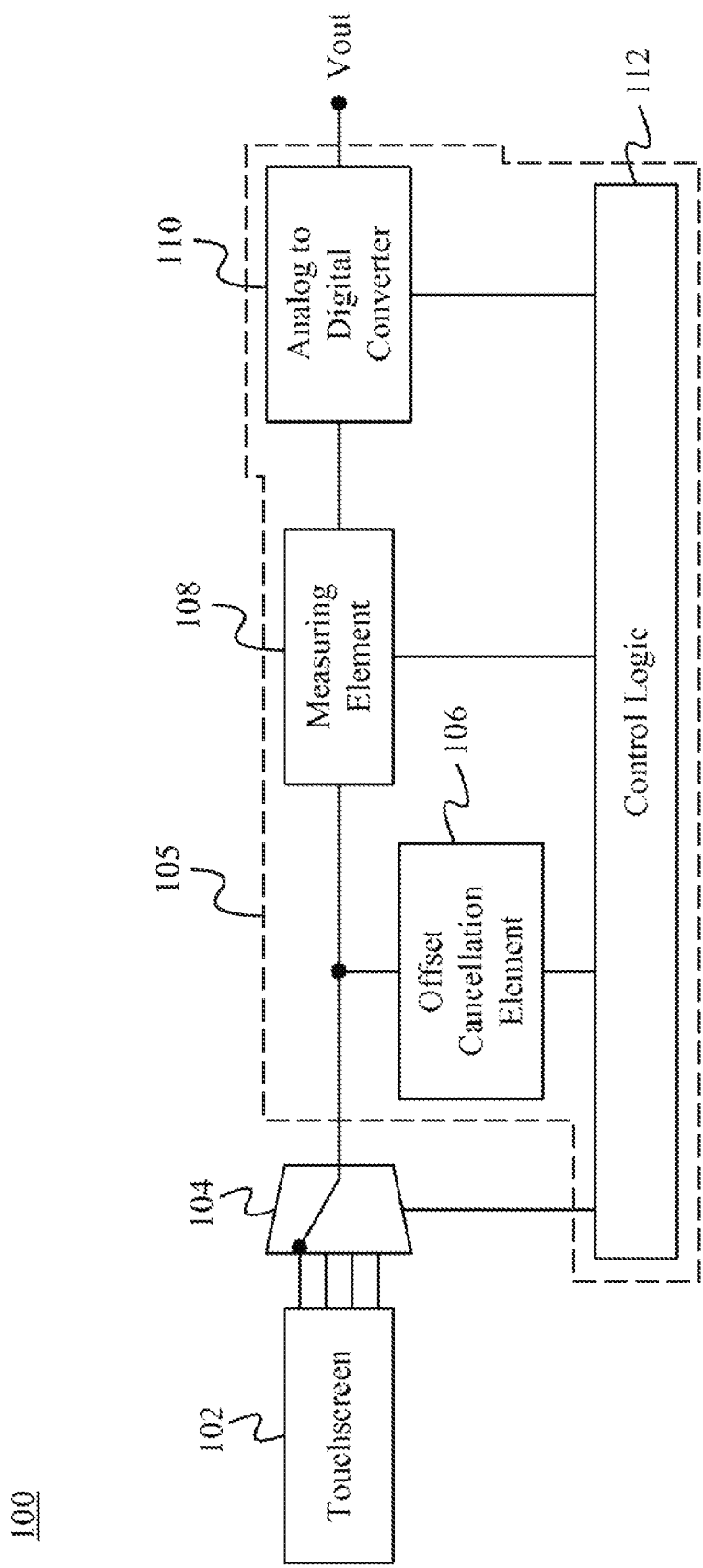
FIG. 1A illustrates a simplified block diagram of a touchscreen system according to some embodiments.

FIG. 1 illustrates a simplified block diagram of a touchscreen system 100 according to some embodiments. The touchscreen system 100 comprises a touchscreen 102, a multiplexer 104, a capacitance-to-voltage converter 105 that includes an offset cancellation element 106, a measuring element 108, an analog-to-digital converter (ADC) 110 and control logic 112. Alternatively, the touchscreen system 100 is able to comprise more or less of the above elements or additional elements which are well known in the art. For example, in some embodiments multiple measuring elements 108 and multiplexers 104 are able to be utilized. In such embodiments, the multiple multiplexers are able to be coupled to multiple sensors (not shown) of the touchscreen 102 and selectively output signals from the desired sensors to the multiple measuring elements. Further, in some embodiments, the measuring element 108, the ADC 110, the control logic 112, and the offset cancellation element 106 are able to be formed onto a single integrated microchip (IC). Alternatively, one or more of the above elements are able to be external to the IC and/or additional elements are able to be incorporated within the IC.

The touchscreen 102 is operably coupled to the input of the multiplexer 104 such that each of the sensors (not shown) on the touchscreen 102 are able to be coupled to the input of the multiplexer 104. In some embodiments, the touchscreen is a capacitive touchscreen having one or more capacitive sensors. It is understood that the term touchscreen used herein refers to touch pads, touch panels, touch switches or any other device used for sensing touches. The multiplexer 104 is operably coupled to the input of measuring element 108 and the output of the offset cancellation element 106 such that the multiplexer 104 is able to selectively output a signal received from one of the sensors to the measuring element 108 along with the output of the offset cancellation element 106. In some embodiments, the offset cancellation element 106 is a capacitive digital-to-analog converter (DAC). Alternatively, the offset cancellation element 106 is able to be devices and/or circuitry capable of outputting various capacitances, voltages or both.

The output of the measuring element 108 is operatively coupled to the input of the ADC 110. Thus, the capacitance/voltage measured from the signal received from the multiplexer 104 combined with the signal received from the offset cancellation element 106 are able to be transmitted as an analog voltage to the ADC 110. In some embodiments, the measuring element is an integrator. Alternatively, the measuring element 108 is able to be any circuitry or device capable of receiving a capacitance and outputting a voltage that corresponds to the capacitance as are well known in the art. The output of the ADC 110 is able to be output from the system 100 to a device (not shown) to be controlled by the touchscreen system 100. The control logic 112 is operable coupled to the multiplexer 104, the ADC 110, the measuring element 108 and the offset cancellation element 106 such that it is able to control the operation of the system 100.

Figure 1B:
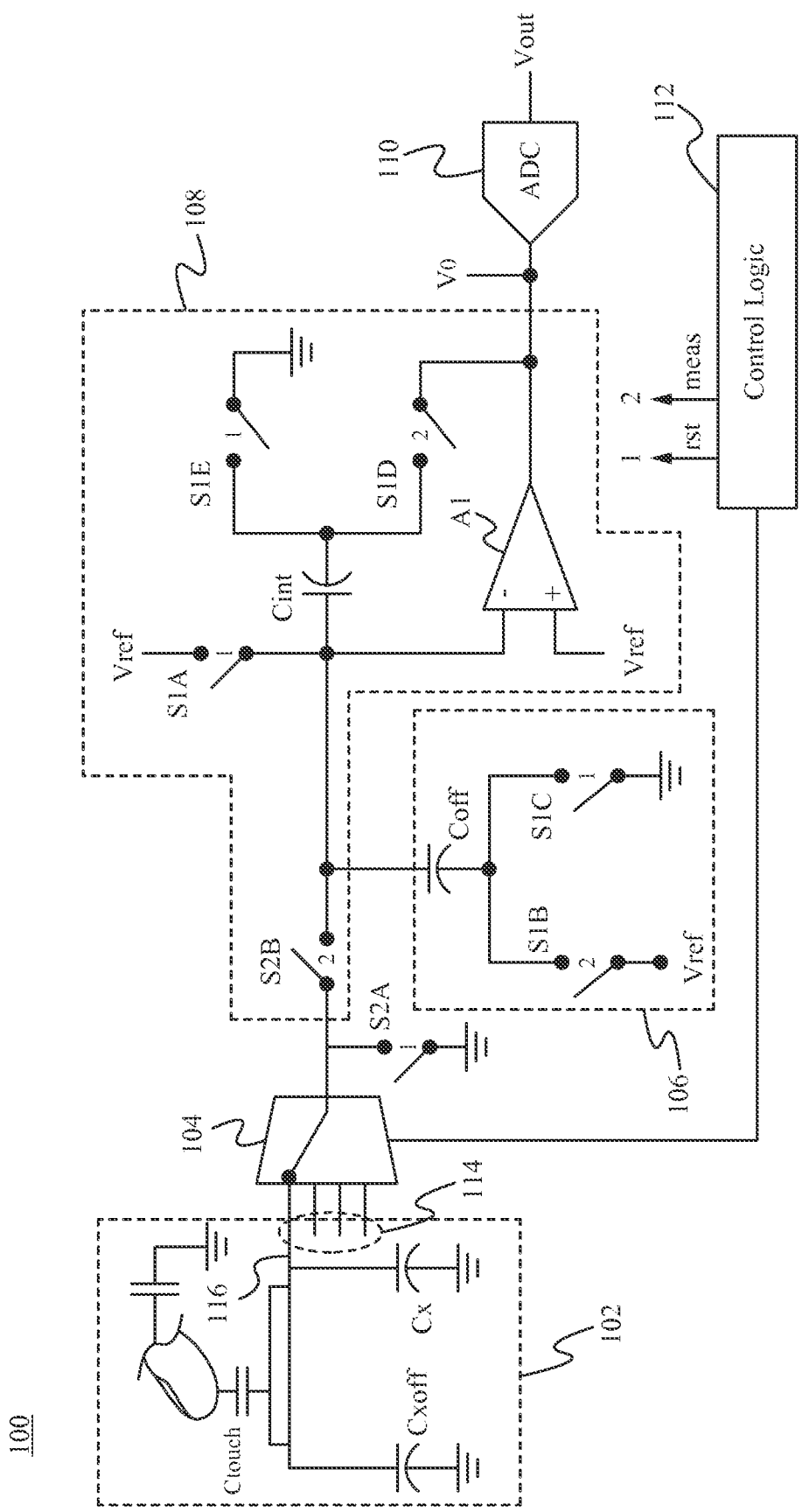
FIG. 1B illustrates a more detailed diagram of a touchscreen system of FIG. 1A according to some embodiments.

FIG. 1B illustrates a more detailed block diagram of a touchscreen system 100 according to some embodiments. In one embodiment, the touchscreen system 100 comprises a switching network formed by the switches S1A-S1E and the switches S2A and S2B that switch between a "reset phase" and a "measure phase". As shown in FIG. 1B, switches that are closed during the reset phase are labeled with a "1" and switches that are closed during the measure phase are labeled with a "2". The reset and measure phases are initiated by "rst" and "meas" signals, respectively, which are output by the control logic 112. However, for the sake of clarity, the connections between the switches and the rst and meas signals output by the controller 112 have been omitted.

In some embodiments, the touchscreen 102 comprises one or more capacitive sensors 114 wherein at least one of the sensors 116 is selected by the multiplexer 104 to be coupled to the offset cancellation element 106 and the measuring element 108. As shown in FIG. 1B, $C_x$ is the capacitance of the sensor 116, $C_{xoff}$ is the stray offset and/or parasitic capacitance of the sensor 116, and $C_{touch}$ is the capacitance change in the sensor 116 due to touching of the touchscreen 102. It is understood that each sensor of the sensors 114 will be subject to similar capacitances and are able to be substituted for the selected sensor 116. It is also understood that although only four sensors 114 are shown coupled to the multiplexer 104, more or less sensors are contemplated to be coupled to any number of multiplexers for choosing a selected sensor 116. The selection of the sensor 116 by the multiplexer 104 is controlled by a control signal sent from the control logic 112 to the multiplexer 104.

In some embodiments, the measuring element 108 comprises an integrating capacitor $C_{int}$ that is selectively coupled to an operational amplifier A1 by the switches S1D and S1E. In some embodiments, the integrating capacitor $C_{int}$ has a capacitance of less than 100 pico-Farads and is preferably in the range of 15 to 25 pico-Farads. In some embodiments, the integrating capacitor $C_{int}$ has a capacitance of 20 pico-Farads. Alternatively, the integrating capacitor is able to have more or less capacitance. Specifically, during the reset phase (wherein the reset signal rst is asserted by the logic control 112), the switch SR couples the inverting input of the amplifier A1 to a reference voltage $V_{ref}$ and the switch S1D is opened and the switch S1E is closed, causing the integrating capacitor $C_{int}$ to be charged to the reference voltage $V_{ref}$. Further during the reset phase, the switch S2A is closed thereby coupling the output of the multiplexer 104 to ground. As a result, the capacitance $C_x$ of the selected sensor 116 is discharged to ground along with the stray/parasitic offset capacitance $C_{xoff}$ (and/or capacitance added due to a touch event $C_{touch}$).

In some embodiments, the offset cancellation element 106 comprises the offset cancellation capacitor $C_{off}$ which is coupled to the inverting input of the operational amplifier A1. In some embodiments, the offset cancellation capacitor $C_{off}$ and the integrating capacitor $C_{int}$ have capacitances that are multiples of a chosen unit capacitor to form good matching between them. For example, if the chosen unit capacitor had a capacitance of 2 pico-Farads, $C_{off}$ and $C_{int}$ could have values of 60 pico-Farads and 20 pico-Farads, respectively. The offset cancellation capacitor $C_{off}$ is able to be charged to the reference voltage $V_{ref}$ during the reset phase by the activation of the switch S1C which grounds the second terminal of the offset cancellation capacitor $C_{off}$. Therefore, during the reset phase after a settling time, the condition of the capacitances in the touchscreen system are such that the integrating capacitor $C_{int}$ the offset cancellation capacitor $C_{off}$ are charged to the reference voltage $V_{ref}$ and the sensor capacitance $C_x$ and the offset capacitance $C_{xoff}$ are discharged to ground.

After the reset phase, the reset signal rst is de-asserted and the measurement signal meas is asserted thereby starting the measurement phase. This switching between phases is generally performed by ensuring non-overlapping of the control signals rst and meas generated by control logic 112. During the measurement phase, the switches S1E and S1A are open (because they are no longer receiving the reset signal rst), and the switch S1D is closed by assertion of the measurement signal meas. As a result, the integrating capacitor $C_{int}$ is coupled between the output of the operational amplifier A1 and the inverting input of the operational amplifier A1. Thus, because the integrating capacitor $C_{int}$ is charged to the voltage $V_{ref}$ with respect to the inverting input terminal and the non-inverting input of the operational amplifier A1 is also referenced to the voltage $V_{ref}$, the initial output of the operational amplifier A1 will be zero. Also during the measurement phase, the switch S2B is closed with the switch S2A being opened when the reset signal rst was de-asserted. Further, when the de-assertion of the reset signal rst causes the switch S1C to open and the measurement signal meas causes S1B to close, the offset cancellation capacitor $C_{off}$ is de-coupled from ground and coupled to the reference voltage $V_{ref}$. The result of this closing and opening of these switches is that a positive charge equal to COFF*Vref (where COFF is the capacitance of the offset cancellation capacitor $C_{off}$), is transferred from the offset cancellation capacitor $C_{off}$ to integrating capacitor $C_{int}$. Also, a negative charge equal to −CX*Vref is transferred from the output terminal of the multiplexer 104 to integrating capacitor $C_{int}$ (where CX is the sum of the capacitances on the sensor $C_x$, any stray/parasitic offset capacitance $C_{xoff}$ and/or capacitance added due to a touch event $C_{touch}$).

The ADC 110 is operably coupled to the output Vo of the measuring element 108 such that the voltage output by the operational amplifier A1 is converted from an analog voltage value to a digital voltage value Vout. The ADC 110 is also able to be operably coupled to the control logic 112 such that the control logic 112 is able to sample the digital output Vout of the ADC 110. As a result, the control logic 112 is able to select different offset cancellation element 106 capacitance. Additionally, it should be noted that Vo and Vout represent the same voltage in analog and digital form respectively, and thus any measurements of the output Vout by the control logic 112 or other elements in alternate embodiments are able to be measurements of the output Vo wherein the measuring circuitry is correspondingly adjusted for the form of the represented voltage.

Figure 2A:
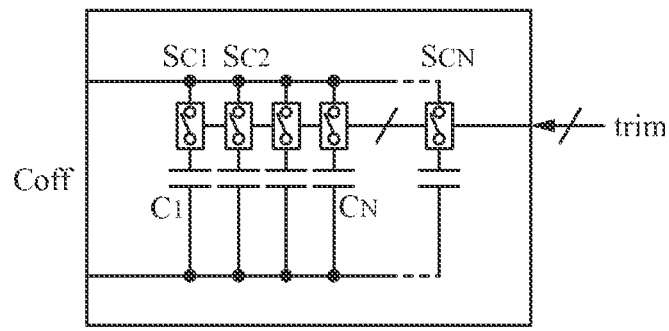
FIG. 2A illustrates a capacitor circuit of an offset cancellation capacitor of an offset cancellation element according to some embodiments.

In some embodiments, the offset cancellation element 106 is able to comprise multiple capacitors and/or variable capacitors and associated circuitry such that the value of the capacitance/voltage output by the offset cancellation element 106 is able to be dynamically adjusted. In some embodiments, the offset cancellation element 106 is a capacitive digital-to-analog converter. FIG. 2A illustrates a capacitor circuit 200A of the offset cancellation capacitor $C_{off}$ of the offset cancellation element 106 according to some embodiments. As shown in FIG. 2A, the offset cancellation capacitor $C_{off}$ comprises one or more additional fingers of capacitors C1-CN having one common plate. The one or more capacitors C1-CN are able to be selected by a plurality of switches $S_{c1}$-$S_{cn}$, in response to one or more digital signals trim effectively providing a set of selectable parallel capacitive elements C1-CN that are able to be used to adjust the capacitance value of the offset cancellation capacitor $C_{off}$. It is understood, that the one or more digital signals trim are able to be produced by the control logic 112 based on output Vout received from the ADC 110.

Figure 2B:
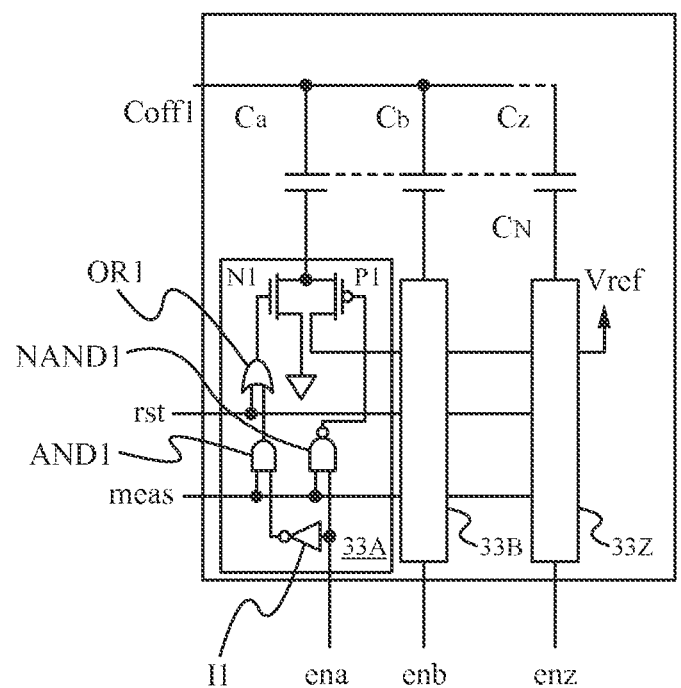
FIG. 2B a capacitor circuit of an offset cancellation capacitor of an offset cancellation element according to some embodiments.

FIG. 2B illustrates a capacitor circuit 200B of the offset cancellation capacitor $C_{off}$ of the offset cancellation element 106 according to an alternate embodiment. Specifically, as shown in FIG. 2B, the offset cancellation capacitor $C_{off}$ is able to include a single first terminal and multiple fingers connected to multiple second terminals. Further, one or more capacitor sections $C_a, C_b \ldots -C_z$ are able to have a common terminal $C_{off1}$, which is then connected to the non-inverting input of the amplifier A1. The other fingers (or alternatively the second terminals of individual capacitors having a common first terminal connection) are alternatively and intermittently coupled to ground or reference voltage $V_{ref}$ depending on the state of corresponding enable signals ena, enb . . . –enz. When the capacitor circuit 200B is used in place of a single capacitor for $C_{off}$ as shown in FIG. 1B, the switch sections S1B and S1C are able to be omitted, as their functions are performed, albeit in a different manner, by the capacitor circuit 200B. The enable signals ena-enz select ground to be applied to the corresponding capacitor section $C_a$-$C_z$ by activating the transistor N1 in a set of corresponding identical switching circuits 33A-33Z, or voltage reference $V_{ref}$ to be applied by enabling transistor P1. A logical-AND gate AND1 and a logical-NAND gate NAND1, along with an inverter Ii, are coupled to provide a selection circuit that activates one of the transistors Ni or P1 when measurement control signal meas is asserted during a measurement cycle. The resulting operation reduces the variation in the feedback factor for the amplifier A1 according to the equation:

$$\text{Feedback Factor} = (CX + COFF + CXOFF + CINT)/CINT \quad (1)$$

During the measurement phase, only the capacitor sections $C_a$-$C_z$ that are coupled to the voltage reference $V_{ref}$ will result in a charge transfer. Indeed, because both terminals of any of the capacitor sections $C_a$-$C_z$ that are coupled to ground remain at ground potential during the measurement phase, no net charge is able to be transferred to $C_{int}$ from those capacitor sections (although those sections are still considered in the feedback factor calculations as shown in equation (1)). During the reset phase, all of the capacitor sections $C_a$-$C_z$ are able to be coupled between ground and the inverting input terminal of the amplifier A1. There is no variation in the capacitance at the terminal $C_{off1}$ of the capacitor circuit 200B during the measurement phase, no matter the value of $C_{xoff}$ to which the capacitance at terminal $C_{off1}$ is set during the reset phase.

For example, because the values of CX and CXOFF are able to change from small values such as 4 pico-Farads to large values such as 120 pico-Farads, if CINT is a value such as 20 pico-Farads, the variation in the feedback factor with a COFF value equal to zero will be between approximately 1 to approximately 7. However, if COFF is set to a value such as 60 pico-Farads, it can be seen from the feedback factor equation that the variation in the feedback factor will become between approximately 4 to approximately 10. Thus, by manipulating the value of COFF, the variation of the feedback factor is reduced from 7 times the lower limit (1 to 7) to only 2.5 times the lower limit (4 to 10). This simplifies the design of the amplifier A1 because it is easier to design an amplifier that works with low power if the feedback range is smaller.

The output voltage Vo of the operational amplifier A1 is equal to the output-referred voltage across the integrating capacitor $C_{int}$ plus $V_{ref}$. This output-referred voltage can be computed from $Vo = Q_f/CINT + V_{ref}$ (where $Q_f$ is the charge on the integrating capacitor $C_{int}$, and CINT is the capacitance of the integrating capacitor $C_{int}$). Therefore, the total charge transferred to the integrating capacitor $C_{int}$ during the measurement phase is $CX*V_{ref}-COFF*V_{ref}=\Delta Q_f$. Further, because the initial charge on the integrating capacitor $C_{int}$ is $-CINT*V_{ref}$, the final value of charge $Q_f$ is:

$$-CINT*V_{ref} + CX*V_{ref} - COFF*V_{ref} \quad (2)$$

and output voltage Vo is given by:

$$Vo = (-CINT*V_{ref} + CX*V_{ref} - COFF*V_{ref})/CINT + V_{ref} = V_{ref}*(CX-COFF)/CF \quad (3)$$

It is understood that the same result can be obtained by applying charge conservation at the inverting input terminal of the operational amplifier A1.

Therefore, it can be seen that the output voltage Vo is proportional to the capacitance of the sensor $C_x$ (plus any stray/parasitic offset capacitance $C_{xoff}$ and/or capacitance added due to a touch event $C_{touch}$) minus the capacitance of the offset cancellation capacitor $C_{off}$. As a result, the capacitance of the offset cancellation capacitor $C_{off}$ is able to be adjusted such that it substantially "cancels out" the capacitance of the sensor $C_x$ and/or the stray/parasitic offset capacitance $C_{xoff}$, leaving only or substantially only the capacitance on the sensor 116 due to a touch event $C_{touch}$. As described in detail below, this ability to substantially dynamically "cancel out" the capacitance and/or stray capacitance enables the touchscreen system 100 to undergo an initial background calibration wherein the initial values of sensor and/or stray capacitance for the sensor 116 are measured and the offset cancellation element 106 is dynamically adjusted to substantially cancel out the measured amount of capacitance. Similarly, as described below, this ability enables the touchscreen system 100 to adjust the offset cancellation element 106 as changes to the environment alter the sensor and/or stray capacitance such that the offset cancellation capacitance corresponds to the changing sensor/stray capacitance.

This provides the advantages of utilizing a smaller integration capacitor $C_{int}$, as the integration capacitor would only need to be able to handle the values of the $C_{touch}$ capacitance without saturating the integrating capacitor $C_{int}$, and thereby altering the output Vo. Contrarily, without this cancellation ability, the integration capacitor $C_{int}$ would need to be sufficiently large to handle not only the value of the $C_{touch}$ capacitance, but also the value of the $C_{touch}$, the $C_x$ and $C_{xoff}$ capacitances added together. Furthermore, the ability to utilize a smaller integration capacitor $C_{int}$, increases the resolution of the measuring element 108 because larger capacitors are unable to measure smaller charges received from the sensor 116. Moreover, this all results in an improved dynamic range of the touchscreen system 100 because both small and large capacitances are able to be measured by the system as their capacitance offset values are able to be substantially cancelled as needed by the offset cancellation capacitor $C_{off}$.

Figure 3A:
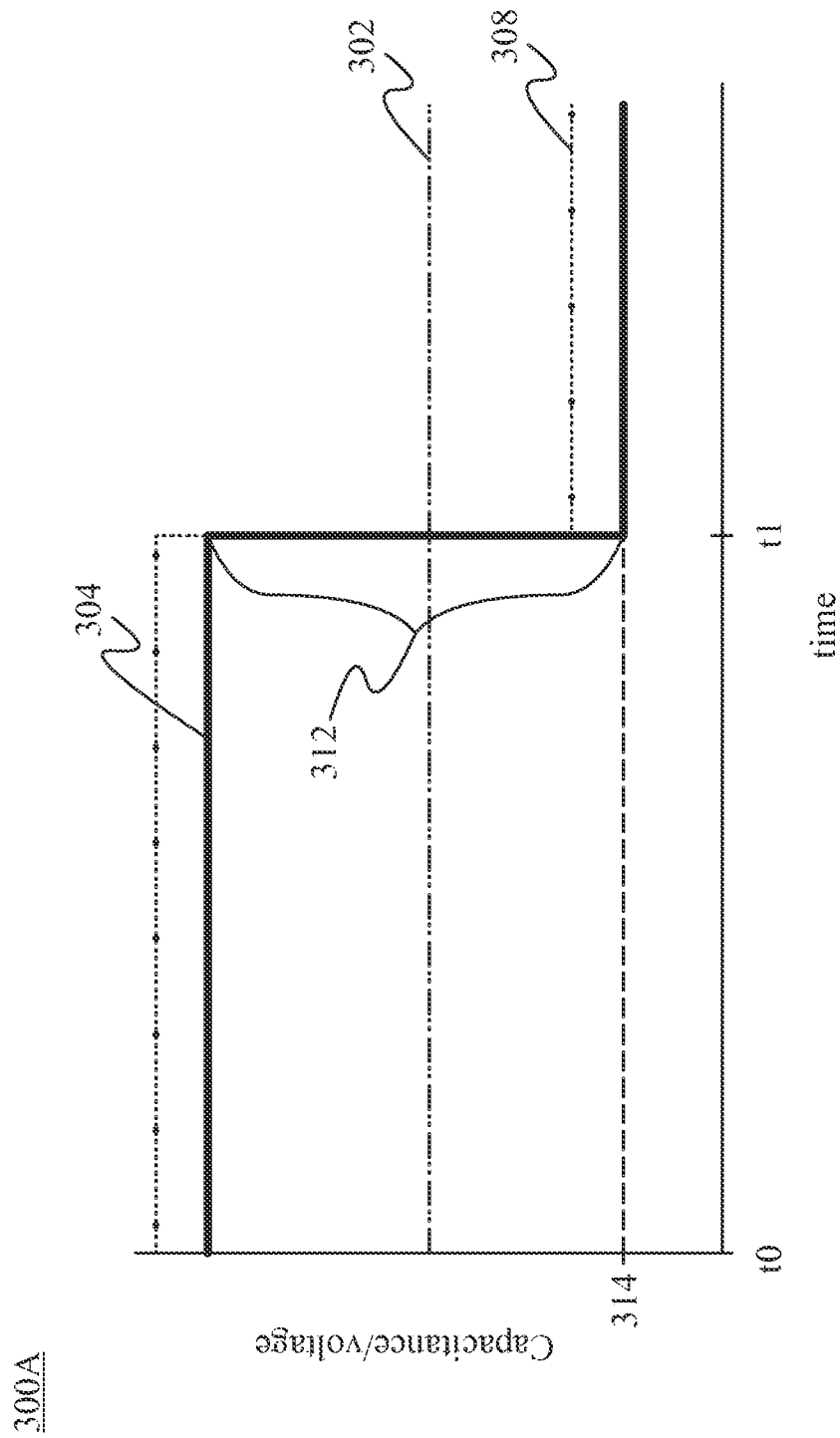
FIG. 3A illustrates a graph of the capacitance measured by the control logic from the selected sensor over time according to some embodiments.

The operation of the touchscreen system 100 when performing a background calibration will now be discussed in conjunction with FIG. 3A which illustrates a graph 300A of the capacitance measured by the control logic 112 from the selected sensor 116 over time according to some embodiments. It should be noted that although the following discussion relates to an upper limit, one skilled in the art would understand that the discussion also is able to relate to a lower limit of the system 100 except that the changes in values are reversed (e.g. increases/incrementing becomes decreases/de-incrementing). As shown in FIG. 3A, the measurement element upper limit line 302 represents an upper capacitance value that the measurement element 108 is able to accurately measure before the output of the measurement element 108 is saturated (i.e. no longer accurately corresponds to the input capacitance/voltage). In some embodiments, the upper limit line 302 is determined based on the saturation value of the integrating capacitor $C_{int}$. Alternatively, the upper limit line 302 is able to be determined based on one or more additional components of the measurement element 108 such as the operational amplifier A1 according to methods well known in the art.

The baseline 304 represents the average total non-touch capacitance/voltage received from the selected sensor 116 by the measurement element 108 over a calculation period. In other words, the baseline 304 represents the average capacitance/voltage values received from the sensor 116 when the sensor is not being touched by a user. In some embodiments, the baseline 304 is calculated by the logic control 112 by averaging the capacitance/voltage received from the selected sensor 116 over the calculation period. In some embodiments, the received capacitance/voltage to be averaged is a digital value Vout output by the ADC 110 to the control logic 112. Alternatively, the received capacitance/voltage to be averaged is able to be an analog value from the output Vo or input of the measurement element 108. This average total capacitance/voltage received from the selected sensor 116 comprises the capacitance of the sensor $C_x$ and the stray capacitance $C_{xoff}$ less the offset cancellation capacitance $C_{off}$. Capacitance/voltage values received during a touch event 306A, 306B (see FIGS. 3B and 3C) such that the total also includes touch capacitance $C_{touch}$ are excluded from the calculation of the baseline 304. As a result, the slope of the baseline 304 remains substantially constant during touch events 306A, 306B as represented by the dotted lines below the touch events (see FIGS. 3B and 3C). Alternatively, values during touch events 306A, 306B are able to be included in the calculation of the baseline 304.

Figure 3B:
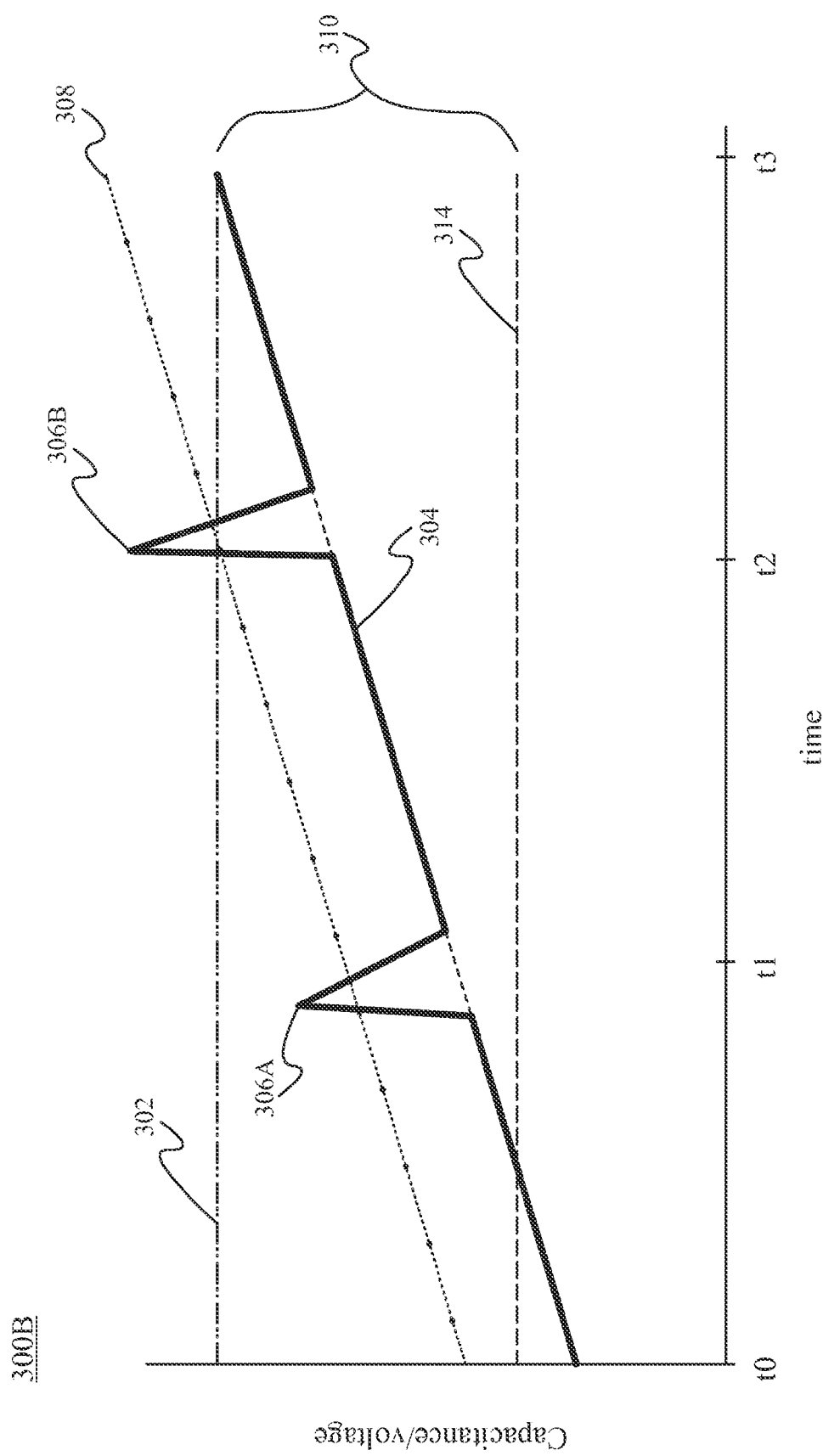
FIG. 3B illustrates a second graph of capacitance measured by the control logic from the selected sensor over time according to some embodiments.
Figure 3C:
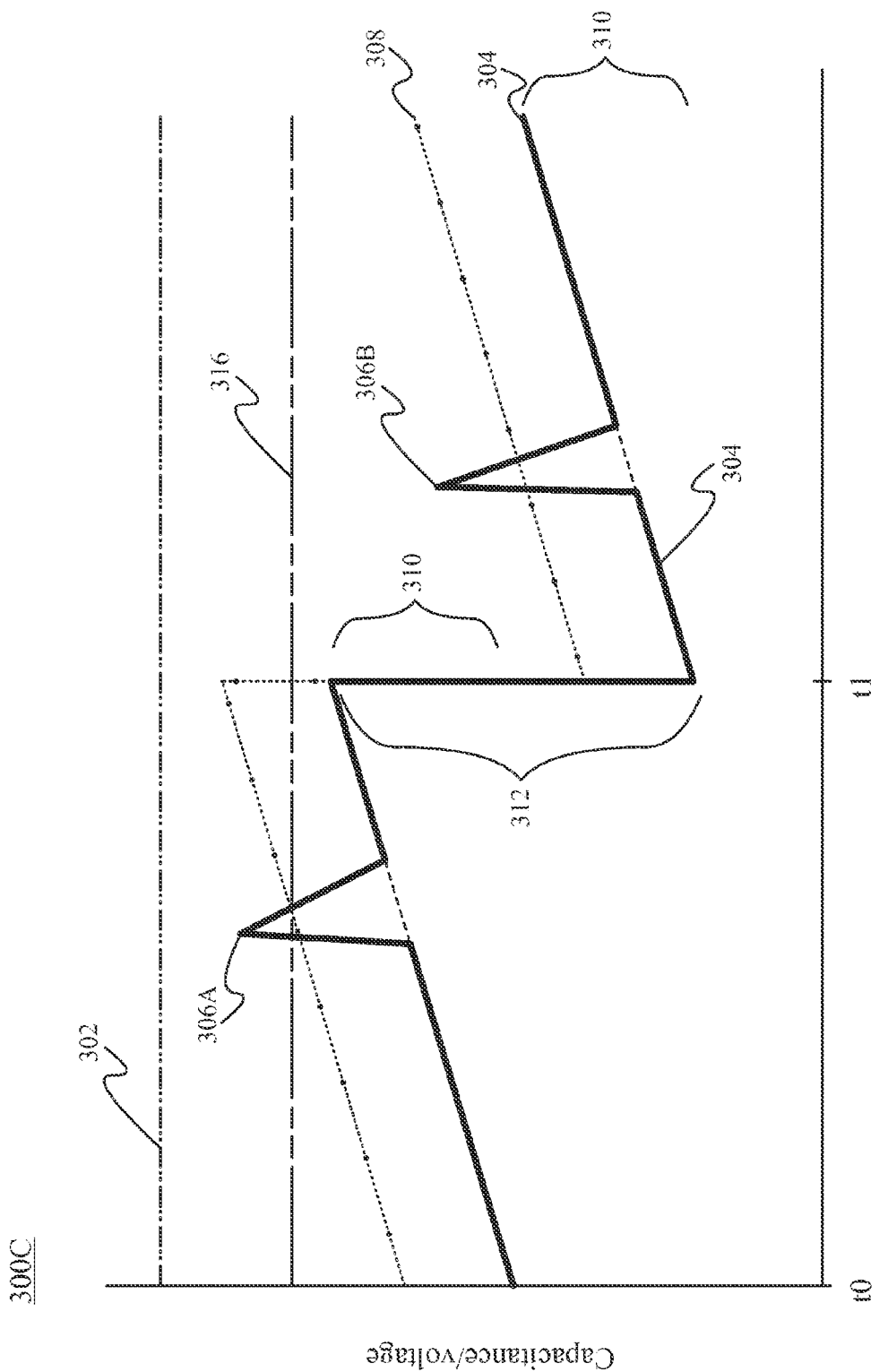
FIG. 3C illustrates a third graph of capacitance measured by the control logic from the selected sensor over time according to some embodiments.

In some embodiments, touch events 306A, 306B are identified/defined as a sharp jump and fall in the sensed capacitance/voltage of the sensor over a predefined touch event period, wherein the "jump" in capacitance/voltage measured over the touch event period exceeds a touch threshold value 308 of a predetermined capacitance/voltage value. Two examples of touch events are shown in FIGS. 3B and 3C which show touch events 306A and 306B The touch threshold value 308 is a determined by the logic control 112 as a predetermined capacitance/voltage value greater than the measured baseline value 304. In some embodiments, the predetermined capacitive/voltage value greater than the baseline 304 is selected such that it is less than the average highest increase due to a touch event $C_{touch}$, but greater than the average fluctuations of the baseline 304 without a touch event 306A, 306B.

Finally, a desired output level 314 represents a desired predetermined average capacitance/voltage output level. Thus, in operation, it is desired that the baseline 304 level substantially equal the desired output level 314. In some embodiments, this desired output level 314 is determined based on the upper limit 302, or lower limit (not shown). Thus, as shown in FIG. 3A at a time to, the baseline 304 exceeds both the desired output level 314 and the upper limit 302. As a result, the measuring element 108 will not be able to accurately measure the capacitance on the sensor 116 at t0. This is often the case when environmental drifts change the sensor capacitance (CX+CXOFF) such that any set offset cancellation capacitance becomes ineffective. When the control logic 112 calculates the baseline 304 and determines that the baseline exceeds the desired output level 314, the control logic 112 is able to send a signal (e.g. trim, ena, enb, enz) to the offset cancellation element 106 causing the capacitance of the offset capacitor element $C_{off}$ to incrementally increase. Correspondingly, the baseline 304 is incrementally decreased according to the equation (3) by a capacitance/voltage increment 312. This incremental increasing of the offset capacitor $C_{off}$ is continued until the baseline 304 equals or substantially equals the desired output level 314 as shown in FIG. 3A at time ti. Thus, by using an accurate offset cancellation element 106 it is able to be ensured that any change in the sensor 116 output is a fixed/known change in the amplifier A1 output Vo. This known/fixed change is then able to be taken into account when determining if a touch event 306A, 306B has occurred thereby avoiding errors in touch detection of the system 100. In some embodiments, the increment of increase is one least significant bit (LSB) of the digital code received by the offset cancellation element 106. Alternatively, the control logic 112 is able to increase the digital code by more than one LSB per increment. After the logic control 112 determines that the baseline 304 is sufficiently close to the desired output level 314, it stops incrementing the offset cancellation element 106. Throughout this process the logic control 112 is able to adjust the touch threshold 308 such that it remains a predetermined level above the baseline 304.

The operation of the touchscreen system 100 when dynamically adjusting for environmental changes to background capacitance will now be discussed in conjunction with FIGS. 3B and 3C which illustrate graphs 300B, 300C of the background capacitance measured by the control logic 112 from the selected sensor 116 over time. Again, it should be noted that although the following discussion of FIGS. 3B and 3C relates to an upper limit line 302 and an upper drift threshold 316, one skilled in the art would understand that the discussion also is able to relate to a lower limit and lower drift threshold of the system 100 except that the changes in values will be reversed (e.g. increases/incrementing becomes decreases/de-incrementing). FIG. 3B illustrates the challenges presented by changes in the environment to the touchscreen system 100. Specifically, FIG. 3B illustrates a baseline 304 and touch threshold 308 in relation to the upper limit line 302 and the desired output value 314 at a times t043. At the time to, the baseline 304 is at the desired output value 324 and below the upper limit line 302. As time progresses, the baseline value 304 (and corresponding touch threshold 308) begins to increase due to changes in the environment from t0 to t3. Specifically, because environment changes can alter the sensor capacitance $C_x$ and/or stray capacitance $C_{xoff}$ values, it causes the baseline 304 to change in value equal to a drift value 310. For example, when the humidity increases around the touchscreen 102 it increases the sensor and or stray capacitance $C_x$, $C_{xoff}$ of the sensor 116 over time, and thus causes the baseline 304 to have a positive slope. Similarly, if humidity were to decrease it would result in the baseline 304 having a negative slope. At time ti, the drift 310 is not sufficient to interfere with the measuring element 108 sensing the touch event 306A by determining if the received capacitance/voltage exceeded the touch threshold 308 within the touch event period. However, by the time t2, the drift value 310 is such that the touch threshold 308 is above the upper limit line 302. As a result, the system 100 cannot determine if the received capacitance/voltage exceeded the touch threshold 308 within the touch event period because it is not able to accurately measure the received capacitance/voltage at that level. At time t3, the baseline 304 itself can no longer be accurately calculated as it has exceeded the upper line limit 302. In the past, the only way of overcoming this problem was to increase the capacitance of the integrating capacitor $C_{int}$ such that the upper limit line 302 was correspondingly increased. However, this increases costs and reduces the dynamic range of the touchscreen system.

FIG. 3C illustrates how the touchscreen system 100 overcomes this problem without increasing the size of the integrating capacitor $C_{int}$. Specifically, as shown in FIG. 3C, an upper drift threshold 316 is determined by the control logic 112 in order to prevent the drift value 310 from causing the touch threshold 308 from exceeding the upper limit line 302. In some embodiments, the upper drift threshold value 316 is determined based on the touch threshold value 308 such that the upper drift threshold 316 is set sufficiently lower than the upper limit line 302 such that the baseline 304 will be dynamically adjusted lower before the touch threshold 308 reaches the upper limit line 302. Alternatively, the upper drift threshold 316 is able to be determined based on a set difference value below the upper limit line 302. Between times t0 and ti, similar to as in FIG. 3C, the baseline 304 begins to increase by the drift value 310 due to environmental changes. However, when the control logic 112 determines that the baseline 304 has reached or passed the upper drift threshold 316 at time ti, the control logic 112 is able to send a signal (e.g. trim, ena, enb, enz) to the offset cancellation element 106 causing the capacitance of the offset capacitor element $C_{off}$ to incrementally increase. Correspondingly, the baseline 304 begins to incrementally decrease according to equation (3) by a capacitance/voltage drift offset value 312. This incremental increasing of the offset capacitor $C_{off}$ is continued until the baseline 304 drops below the upper drift threshold 316 and or equals the desired output level 314.

The control logic 112 is also able to transmit the capacitance/voltage value of the total number a drift offsets 312 performed by the offset cancellation element 106 to the ADC 110. As a result, the output of the ADC Vout is able to be adjusted by the total number of drift offsets 312 performed such that the output Vout is the same as if no adjustments were made. In other words, it allows the adjustments to be transparent to the outside of the system 100. In some embodiments, the total number of drift offsets 312 are stored for each sensor 114 such that they are able to be used during a subsequent differential measurement of the sensors 114. Specifically, the total number of offsets 312 for each of the sensors 114 is able to be used such that during a differential measurement only the non-touch capacitance/voltage is differentially measured. In some embodiments, the increment of increase is one least significant bit (LSB) of the digital code received by the offset cancellation element 106. Alternatively, the control logic 112 is able to increase the digital code by more than one LSB per increment. Throughout this process the logic control 112 is able to adjust the touch threshold 308 such that it remains a predetermined level above the baseline 304. The control logic 112 continues to make these adjustments whenever the baseline 304 reaches the upper drift threshold 116. In some embodiments, this adjustment is performed for each of the sensors 114.

As a result, the dynamic adjustment of the touchscreen system 100 provides the advantage of increased dynamic range. Specifically, because substantially all non-touch capacitance experienced by the sensors 114 are able to be eliminated from the measurement by dynamic adjustment, the measurement element 106 is able to utilize a smaller integrating capacitor $C_{int}$. This smaller capacitor allows the system to be sensitive to lower capacitances/voltages (wherein cancellation is not needed) while still being able to handle higher capacitances/voltages (where cancellation is needed). Accordingly, the resolution and/or dynamic range of the system is improved.

Figure 4:
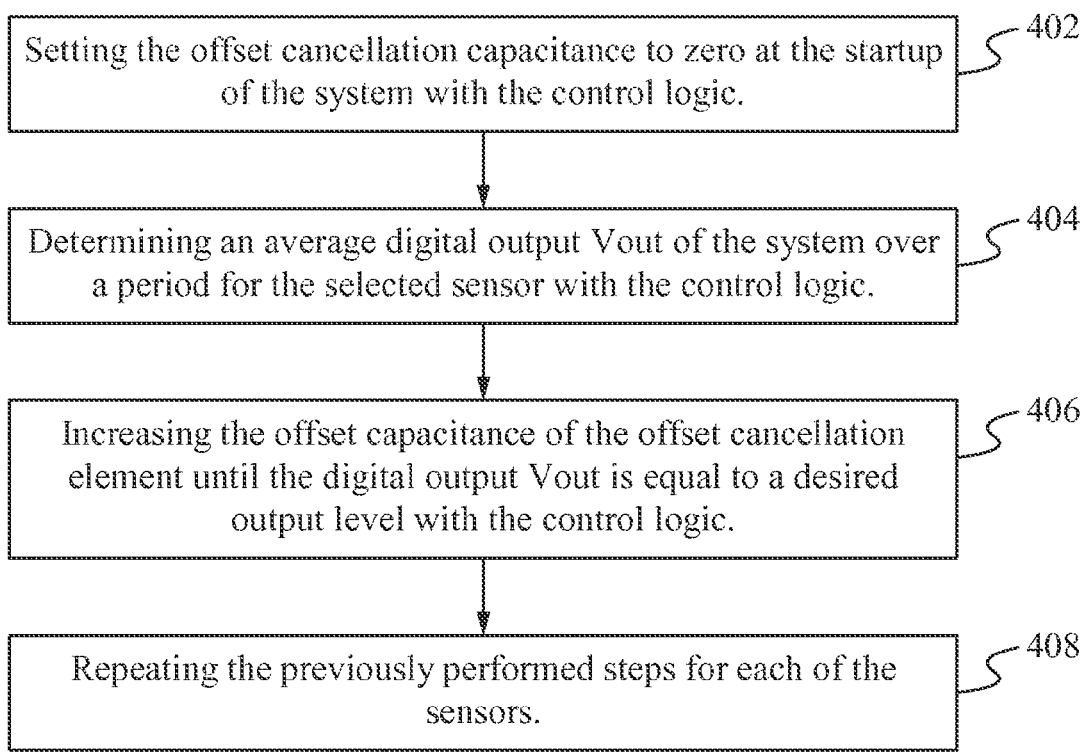
FIG. 4 illustrates a flow chart of a method of calibrating a touchscreen system for initial background capacitances according to some embodiments.

A method of calibrating the touchscreen system 100 for initial background capacitances according to some embodiments will now be discussed in conjunction with the flow chart 400 shown in FIG. 4. At the step 402, the control logic 112 sets the offset cancellation capacitance $C_{off}$ to zero at the startup of the system 100. Alternatively, in some embodiments, the control logic 112 sets the offset cancellation capacitance $C_{off}$ to a maximum value or high value. Alternatively, step 402 is omitted. At the step 404, the control logic 112 determines an average digital output Vout of the system 100 over a period for the selected sensor 116. Alternatively, the control logic 112 determines an average analog input or output Vo of the measuring element 108 for the selected sensor 116. In some embodiments, the period over which the average is taken is greater than the length of an average touch event 306A, 306B. Alternatively, the control logic 112 utilizes another metric different from an average to measure the digital output Vout of the system 100 as are well known in the art. At the step 406, the control logic 112 increases the offset capacitance of the offset cancellation element 106 until the digital output Vout is equal to a desired output level 314. Alternatively, the control logic 112 decreases the offset capacitance of the offset cancellation element 106 until the digital output Vout is equal to a desired output level 314. At the step 408, the previously performed steps are repeated for each of the sensors 114. In some embodiments, the calibrating method 400 is performed at the startup of the touchscreen system 100. Alternatively, the calibrating method 400 is able to be performed periodically or upon request by a user.

Figure 5:
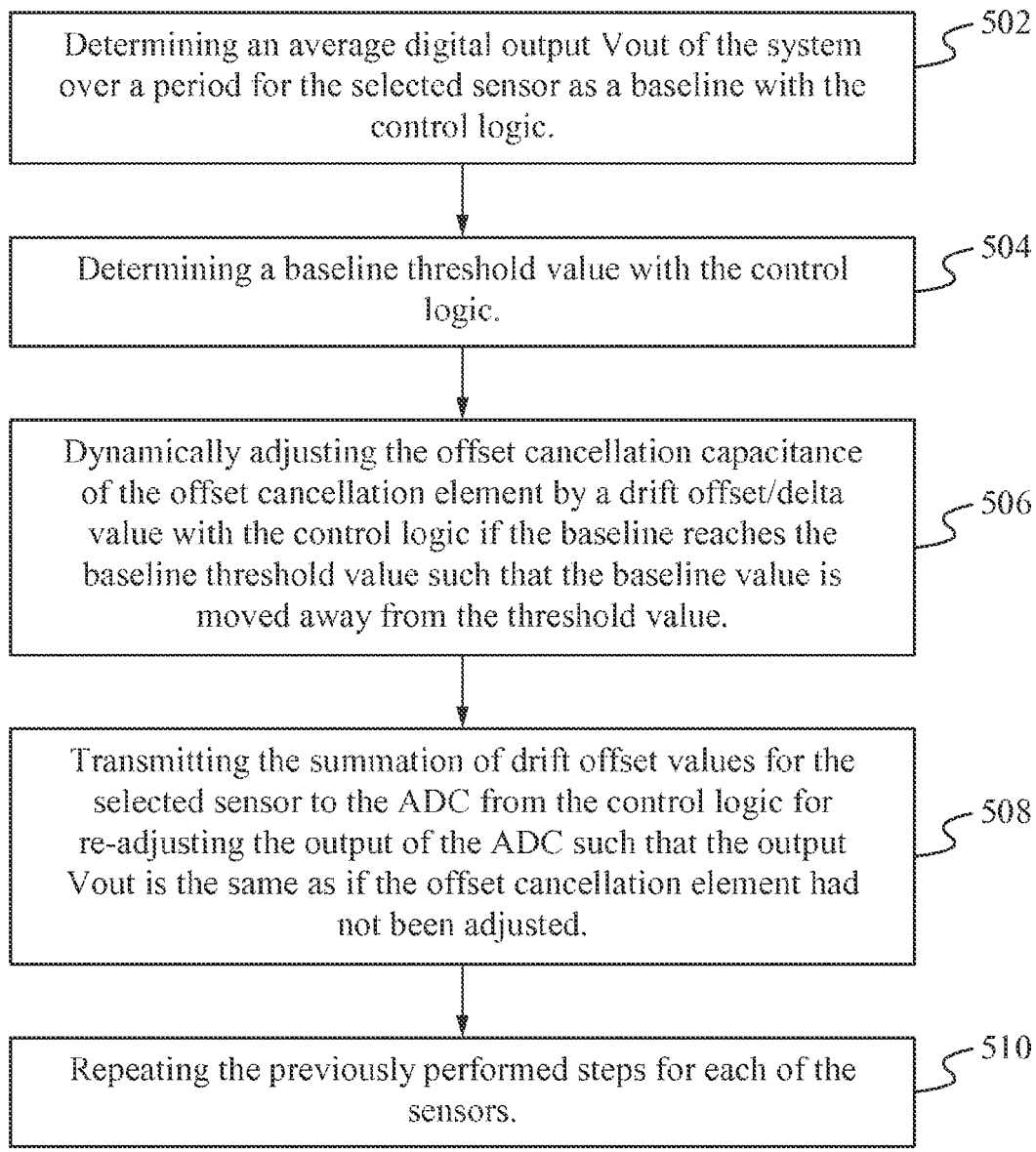
FIG. 5 illustrates a flow chart of a method of dynamically adjusting a touchscreen system for environment changes to background capacitances according to some embodiments.

A method of dynamically adjusting a touchscreen system 100 for environment changes to background capacitances according to some embodiments will now be discussed in conjunction with the flow chart 500 shown in FIG. 5. At the step 502, the control logic 112 determines an average digital output Vout of the system 100 over a period for the selected sensor 116 as a baseline 304. Alternatively, the control logic 112 determines an average analog input or output Vo of the measuring element 108 for the selected sensor 116 as a baseline 304. Alternatively, the control logic 112 utilizes another metric different from an average to measure the digital output Vout of the system 100 as are well known in the art. In some embodiments, output values that occur during touch events 306A, 306B are disregarded when calculating the baseline 304. At the step 504, the control logic 112 determines a baseline threshold value 316. In some embodiments, determination of the baseline threshold value 316 is based on a limit line 302 of the measuring element 108. Alternatively, the control logic 112 is pre-programmed with the baseline threshold value 316. In some embodiments, the limit line 302 is an upper limit or a lower limit of the measuring element 108. In some embodiments, the baseline threshold value 316 is an upper or a lower threshold. At the step 506, the control logic 112 dynamically adjusts the offset cancellation capacitance of the offset cancellation element 106 by a drift offset/delta value 312 if the baseline 304 reaches the baseline threshold value 316 such that the baseline value 304 is moved away from the threshold value 316. In some embodiments, the baseline 304 is distanced below or above the threshold value 316 by the drift offset value 312. In some embodiments, adjusting the offset capacitance of the offset cancellation element 106 comprises incrementing or de-incrementing the offset cancellation element 106 by a LSB. Alternatively, the incrementing or de-incrementing are able to be more than one LSB. At the step 508, the summation of drift offset values 312 for the selected sensor 116 are transmitted to the ADC 110 from the control logic 112 for re-adjusting the output of the ADC 110 such that the output Vout is the same as if the offset cancellation element 106 had not been adjusted. Alternatively, step 508 is omitted. At the step 510, the previously performed steps are repeated for each of the sensors 114. In some embodiments, the summation of drift offset values 312 for each of the sensors 114 are utilized during a subsequent differential measurement process between the sensors 114.

As described above, the method and apparatus for improving the dynamic range of a touchscreen controller provides numerous advantages. Specifically, the touchscreen system 100 has increased dynamic range because it can dynamically adjust an offset cancellation element in capacitance such that it offsets parasitic and sensor capacitances of the sensor thereby leaving only touch event capacitance to be measured by the measuring element. The offset cancellation element is able to adjust to the initial unwanted capacitances of each sensor as well as dynamically adjust to changes in the unwanted capacitance due to the environment. As a result, the capacitance-to-voltage converter and/or touchscreen system is able to utilize a small integrating capacitor thereby lowering cost and improving the dynamic range of the system. The method and apparatus for improving the dynamic range of a touchscreen controller has been described in terms of specific embodiments incorporating details to facilitate the understanding of the principles of construction and operation of the mixed signal processing circuit. Such references, herein, to specific embodiments and details thereof are not intended to limit the scope of the claims appended hereto. It will be apparent to those skilled in the art that modifications can be made in the embodiments chosen for illustration without departing from the spirit and scope of the method and apparatus for improving the dynamic range of a touchscreen controller.

What is claimed is:

1. A capacitance-to-voltage converter for a capacitive touchscreen having one or more capacitance sensors, the converter comprising:
   a capacitance offset cancellation element coupled for alleviating effects of parasitic capacitance on signals produced by one or more of the capacitance sensors;
   an analog-to-digital converter coupled to the offset cancellation element for converting the signals to digital signals; and
   a controller coupled to the offset cancellation element for dynamically adjusting the extent to which the offset cancellation element alleviates the effects of the parasitic capacitance based on the digital signals,
   wherein an offset value of the offset cancellation element is initially set to zero, wherein the controller incrementally increases the offset value from the initial zero value until the digital signals reach a predetermined value.

2. The converter of claim 1, further comprising a measuring element coupled between the offset cancellation element and the analog-to-digital converter, wherein the measuring element comprises an integrating capacitor with a capacitance of less than 20 pico-Farads.

3. The converter of claim 1, wherein the controller averages the value of the digital signals to determine a baseline value.

4. The converter of claim 3, wherein when the baseline reaches a threshold value, the controller adjusts an offset value of the offset cancellation element by a delta value such that the baseline is moved away from the threshold value.

5. A touchscreen system comprising:
   a capacitive touch screen having one or more capacitance sensors; and
   a capacitance-to-voltage converter comprising:
      a capacitance offset cancellation element coupled for alleviating effects of parasitic capacitance on signals produced by one or more of the capacitance sensors;
      an analog-to-digital converter coupled to the offset cancellation element for converting the signals to digital signals;
      a controller coupled to the offset cancellation element for dynamically adjusting the extent to which the offset cancellation element alleviates the effects of the parasitic capacitance based on the digital signals,
      wherein the controller averages the value of the digital signals in order to determine a baseline value, wherein when the baseline reaches a threshold value, the controller adjusts an offset value of the offset cancellation element by a delta value such that the baseline is moved away from the threshold value.

6. The system of claim 5, further comprising a measuring element coupled between the offset cancellation element and the analog-to-digital converter, wherein the measuring element comprises a integrating capacitor with a capacitance of less than 20 pico-Farads.

7. The system of claim 5, wherein the threshold value is an upper threshold and the offset value is increased by the delta value such that the baseline drops below the upper threshold.

8. A method of improving dynamic range in a capacitance-to-voltage converter for a touchscreen having one or more capacitance sensors, the method comprising:
   averaging a digital output associated with a sensor of the converter in order to determine a baseline value;
   determining a baseline threshold value; and
   dynamically adjusting an offset value of an offset cancellation element of the converter by a delta value when the baseline value reaches the baseline threshold value such that the baseline value is distanced from the threshold value.

9. The method of claim 8, wherein the baseline threshold value is an upper threshold of the converter and dynamic adjusting increases the offset value by the delta value such that the baseline value drops below the upper threshold.

10. The method of claim 8, further comprising:
    averaging a second digital output associated with a second sensor of the converter in order to determine a second baseline value;
    determining a second baseline threshold value;
    dynamically adjusting a second offset value of a second offset cancellation element of the converter by a second delta value when the second baseline value reaches the second baseline threshold value such that the second baseline value is distanced from the second threshold value; and
    obtaining a differential measurement between the first digital output as adjusted by the first offset value and the second digital output as adjusted by the second offset value.

* * * * *